United States Patent
Cai et al.

(10) Patent No.: US 10,164,657 B2
(45) Date of Patent: *Dec. 25, 2018

(54) SYSTEMS AND METHODS FOR DIFFERENTIAL MESSAGE SCALING IN A DECODING PROCESS

(71) Applicant: SEAGATE TECHNOLOGY LLC, Cupertino, CA (US)

(72) Inventors: Yu Cai, San Jose, CA (US); Yunxiang Wu, Cupertino, CA (US); Erich F. Haratsch, San Jose, CA (US); Ning Chen, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 15/195,879

(22) Filed: Jun. 28, 2016

(65) Prior Publication Data
US 2016/0308556 A1    Oct. 20, 2016

Related U.S. Application Data

(63) Continuation of application No. 14/261,333, filed on Apr. 24, 2014, now Pat. No. 9,378,765.
(Continued)

(51) Int. Cl.
*H03M 13/11* (2006.01)
*G11B 20/18* (2006.01)
(Continued)

(52) U.S. Cl.
CPC ......... *H03M 13/1111* (2013.01); *G06F 11/10* (2013.01); *G11B 20/1833* (2013.01);
(Continued)

(58) Field of Classification Search
CPC ...................................................... H03M 13/11
(Continued)

(56) References Cited

U.S. PATENT DOCUMENTS

| 4,553,221 A | 11/1985 | Hyatt |
| 4,805,174 A | 2/1989 | Kubot |

(Continued)

FOREIGN PATENT DOCUMENTS

| JP | 2001319433 A | 11/2001 |
| WO | 2010059264 A1 | 5/2010 |
| WO | 2010126482 A1 | 11/2010 |

OTHER PUBLICATIONS

Casado et al., Multiple-rate low- density parity-check codes with constant blocklength, IEEE Translations on commmunications, Jan. 2009, vol. 57, pp. 75-83.

(Continued)

*Primary Examiner* — Fritz Alphonse
(74) *Attorney, Agent, or Firm* — Holland & Hart LLP

(57) ABSTRACT

Systems and method relating generally to data processing, and more particularly to systems and methods for scaling messages in a data decoding circuit. In one embodiment, the systems and methods include applying a variable node algorithm, applying a check node algorithm, calculating a first number of errors, calculating a second number of errors, calculating a difference between the first and second number of errors, multiplying by scalar values to yield a scaled set of messages, and re-applying the variable node algorithm to the scaled set of messages.

20 Claims, 6 Drawing Sheets

Related U.S. Application Data

(60) Provisional application No. 61/974,894, filed on Apr. 3, 2014.

(51) Int. Cl.
*H03M 13/00* (2006.01)
*G06F 11/10* (2006.01)

(52) U.S. Cl.
CPC ... *H03M 13/6325* (2013.01); *H03M 13/6343* (2013.01); *H03M 13/658* (2013.01)

(58) Field of Classification Search
USPC .............................. 714/752, 783, 787, 790
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Takahito |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Ernesto |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky et al. |
| 6,216,249 B1 | 4/2001 | Bliss et al. |
| 6,216,251 B1 | 4/2001 | McGinn |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,393,074 B1 | 5/2002 | Mandyam et al. |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,643,814 B1 | 11/2003 | Cideciyan et al. |
| 6,697,441 B1 | 2/2004 | Bottomley et al. |
| 6,747,827 B1 | 6/2004 | Bassett et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,807,238 B1 | 10/2004 | Rhee et al. |
| 6,810,502 B2 | 10/2004 | Eidson et al. |
| 6,839,774 B1 | 1/2005 | Ahn et al. |
| 6,948,113 B1 | 9/2005 | Shaver |
| 6,970,511 B1 | 11/2005 | Barnette |
| 6,975,692 B2 | 12/2005 | Razzell |
| 6,986,098 B2 | 1/2006 | Poeppelman et al. |
| 7,035,327 B2 | 4/2006 | Nakajima et al. |
| 7,047,474 B2 | 5/2006 | Rhee et al. |
| 7,058,853 B1 | 6/2006 | Song et al. |
| 7,073,118 B2 | 7/2006 | Greenberg et al. |
| 7,093,179 B2 | 8/2006 | Shea |
| 7,117,427 B2 | 10/2006 | Ophir et al. |
| 7,130,875 B2 | 10/2006 | Abe |
| 7,133,228 B2 | 11/2006 | Fung et al. |
| 7,136,244 B1 | 11/2006 | Rothberg |
| 7,184,486 B1 | 2/2007 | Wu et al. |
| 7,191,378 B2 | 3/2007 | Eroz |
| 7,203,887 B2 | 4/2007 | Eroz et al. |
| 7,230,550 B1 | 6/2007 | Mittal et al. |
| 7,237,181 B2 | 6/2007 | Richardson |
| 7,308,061 B1 | 12/2007 | Huang et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,415,651 B2 | 8/2008 | Argon |
| 7,502,189 B2 | 3/2009 | Sawaguchi et al. |
| 7,523,375 B2 | 4/2009 | Spencer |
| 7,587,657 B2 | 9/2009 | Haratsch |
| 7,590,168 B2 | 9/2009 | Raghavan et al. |
| 7,596,196 B1 | 9/2009 | Liu et al. |
| 7,646,829 B2 | 1/2010 | Ashley et al. |
| 7,702,986 B2 | 4/2010 | Bjerke et al. |
| 7,738,202 B1 | 6/2010 | Zheng et al. |
| 7,752,523 B1 | 7/2010 | Chaichanavong et al. |
| 7,779,325 B2 | 8/2010 | Song |
| 7,802,172 B2 | 9/2010 | Vila Casado et al. |
| 7,952,824 B2 | 5/2011 | Dziak et al. |
| 7,957,251 B2 | 6/2011 | Ratnakar Aravind et al. |
| 7,958,425 B2 | 6/2011 | Chugg et al. |
| 7,996,746 B2 | 8/2011 | Livshitz et al. |
| 8,018,360 B2 | 9/2011 | Nayak |
| 8,020,069 B1 | 9/2011 | Feng et al. |
| 8,020,078 B2 | 9/2011 | Richardson |
| 8,295,001 B2 | 3/2012 | Liu |
| 8,161,361 B1 | 4/2012 | Song et al. |
| 8,201,051 B2 | 6/2012 | Tan et al. |
| 8,225,168 B2 | 7/2012 | Yu et al. |
| 8,237,597 B2 | 8/2012 | Liu |
| 8,255,765 B1 | 8/2012 | Yeo et al. |
| 8,261,171 B2 | 8/2012 | Annampedu |
| 8,291,284 B2 | 10/2012 | Savin |
| 8,291,299 B2 | 10/2012 | Li et al. |
| 8,296,637 B1 | 10/2012 | Varnica et al. |
| 8,370,711 B2 | 2/2013 | Alrod et al. |
| 8,381,069 B1 | 2/2013 | Liu |
| 8,413,032 B1 | 4/2013 | Song et al. |
| 8,429,498 B1 | 4/2013 | Anholt et al. |
| 8,443,267 B2 | 5/2013 | Zhong et al. |
| 8,443,271 B1 | 5/2013 | Zhang et al. |
| 8,458,555 B2 | 6/2013 | Gunnam |
| 8,464,142 B2 | 6/2013 | Gunnam et al. |
| 8,495,462 B1 | 7/2013 | Liu |
| 8,516,339 B1 | 8/2013 | Lesea et al. |
| 8,522,120 B2 | 8/2013 | Sun et al. |
| 8,527,849 B2 | 9/2013 | Jakab et al. |
| 8,527,858 B2 | 9/2013 | Zhang et al. |
| 8,531,320 B2 | 9/2013 | Li et al. |
| 8,560,900 B1 | 10/2013 | Bellorado et al. |
| 8,560,930 B2 | 10/2013 | Li et al. |
| 8,566,666 B2 | 10/2013 | Wang et al. |
| 8,578,241 B2 | 11/2013 | Xia et al. |
| 8,595,576 B2 | 11/2013 | Yen |
| 8,610,608 B2 | 12/2013 | Aravind et al. |
| 8,611,033 B2 | 12/2013 | Li et al. |
| 8,612,826 B2 | 12/2013 | Li et al. |
| 8,625,221 B2 | 1/2014 | Feng et al. |
| 8,630,053 B2 | 1/2014 | Yang et al. |
| 8,631,300 B2 | 1/2014 | Han et al. |
| 8,650,451 B2 | 2/2014 | Krishnan et al. |
| 8,656,249 B2 | 2/2014 | Chen et al. |
| 8,681,441 B2 | 3/2014 | Yang et al. |
| 8,700,981 B2 | 4/2014 | Krachkovsky et al. |
| 8,707,123 B2 | 4/2014 | Liu et al. |
| 8,719,686 B2 | 5/2014 | Chen et al. |
| 8,731,115 B2 | 5/2014 | Yang et al. |
| 8,749,907 B2 | 6/2014 | Zhang et al. |

(56) References Cited

U.S. PATENT DOCUMENTS

| | | |
|---|---|---|
| 8,751,889 B2 | 6/2014 | Zhang et al. |
| 8,751,915 B2 | 6/2014 | Zhang et al. |
| 8,756,478 B2 | 6/2014 | Wang et al. |
| 8,775,896 B2 | 7/2014 | Li et al. |
| 8,782,486 B2 | 7/2014 | Zhang et al. |
| 8,788,921 B2 | 7/2014 | Chang et al. |
| 8,817,404 B1 | 8/2014 | Li et al. |
| 8,819,515 B2 | 8/2014 | Chen et al. |
| 8,819,527 B2 | 8/2014 | Xia et al. |
| 8,850,276 B2 | 9/2014 | Xu et al. |
| 8,854,754 B2 | 10/2014 | Zhang et al. |
| 8,862,960 B2 | 10/2014 | Xia et al. |
| 8,862,972 B2 | 10/2014 | Seago et al. |
| 8,873,182 B2 | 10/2014 | Liao et al. |
| 8,880,986 B2 | 11/2014 | Wu et al. |
| 8,885,276 B2 | 11/2014 | Yang et al. |
| 8,908,307 B1 | 12/2014 | Yang et al. |
| 8,917,466 B1 | 12/2014 | Zhang et al. |
| 8,930,780 B2 | 1/2015 | Yang et al. |
| 8,930,792 B2 | 1/2015 | Li et al. |
| 8,949,702 B2 | 2/2015 | Zhang et al. |
| 8,959,414 B2 | 2/2015 | Li et al. |
| 8,977,937 B2 | 3/2015 | Zhang et al. |
| 9,009,557 B2 | 4/2015 | Li et al. |
| 9,019,644 B2 | 4/2015 | Han et al. |
| 9,019,647 B2 | 4/2015 | Zhang et al. |
| 9,041,882 B2 | 5/2015 | Shutou et al. |
| 9,043,684 B2 | 5/2015 | Yang et al. |
| 9,112,531 B2 | 8/2015 | Zhang et al. |
| 9,164,828 B2 | 10/2015 | Xia et al. |
| 9,196,299 B2 | 11/2015 | Wilson et al. |
| 9,214,959 B2 | 12/2015 | Yang et al. |
| 9,219,503 B2 | 12/2015 | Li et al. |
| 9,230,596 B2 | 1/2016 | Yang |
| 9,274,889 B2 | 3/2016 | Zhang et al. |
| 9,281,843 B2 | 3/2016 | Li et al. |
| 9,378,765 B2 * | 6/2016 | Cai .................. G11B 20/1833 |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0126527 A1 | 7/2003 | Kim et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2004/0264284 A1 | 12/2004 | Priborsky et al. |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2006/0195730 A1 | 8/2006 | Kageyama |
| 2007/0185902 A1 | 8/2007 | Messinger et al. |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0216942 A1 | 8/2009 | Yen |
| 2009/0273492 A1 | 11/2009 | Yang et al. |
| 2010/0077276 A1 | 3/2010 | Okamura et al. |
| 2010/0088575 A1 | 4/2010 | Sharon et al. |
| 2010/0150252 A1 | 6/2010 | Camp |
| 2010/0172046 A1 | 7/2010 | Liu et al. |
| 2010/0241921 A1 | 9/2010 | Gunnam |
| 2010/0268996 A1 | 10/2010 | Yang |
| 2010/0322048 A1 | 12/2010 | Yang et al. |
| 2010/0325511 A1 | 12/2010 | Oh |
| 2011/0041040 A1 | 2/2011 | Su |
| 2011/0043938 A1 | 2/2011 | Mathew |
| 2011/0066768 A1 | 3/2011 | Brittner et al. |
| 2011/0167227 A1 | 7/2011 | Yang |
| 2011/0258508 A1 | 10/2011 | Ivkovic |
| 2011/0264987 A1 | 10/2011 | Li |
| 2011/0307760 A1 | 12/2011 | Pisek |
| 2011/0320902 A1 | 12/2011 | Gunnam |
| 2012/0020402 A1 | 1/2012 | Ibing |
| 2012/0038998 A1 | 2/2012 | George |
| 2012/0063023 A1 | 3/2012 | Mathew |
| 2012/0079353 A1 | 3/2012 | Liikanen |
| 2012/0124118 A1 | 5/2012 | Ivkovic |
| 2012/0182643 A1 | 7/2012 | Zhang |
| 2012/0185744 A1 | 7/2012 | Varnica |
| 2012/0121849 A1 | 8/2012 | Xu |
| 2012/0203986 A1 | 8/2012 | Strasser et al. |
| 2012/0207201 A1 | 8/2012 | Xia |
| 2012/0236428 A1 | 9/2012 | Xia |
| 2012/0262814 A1 | 10/2012 | Li |
| 2012/0265488 A1 | 10/2012 | Sun |
| 2012/0317462 A1 | 12/2012 | Liu et al. |
| 2013/0024740 A1 | 1/2013 | Xia |
| 2013/0031440 A1 | 1/2013 | Sharon |
| 2013/0120169 A1 | 5/2013 | Li |
| 2013/0139022 A1 | 5/2013 | Chen et al. |
| 2013/0139023 A1 | 5/2013 | Han et al. |
| 2013/0194955 A1 | 8/2013 | Chang |
| 2013/0198580 A1 | 8/2013 | Chen |
| 2013/0238955 A1 | 9/2013 | D'Abreu |
| 2013/0254616 A1 | 9/2013 | Yang |
| 2013/0254619 A1 | 9/2013 | Zhang |
| 2013/0262788 A1 | 10/2013 | Zhang et al. |
| 2013/0275717 A1 | 10/2013 | Wilson et al. |
| 2013/0322578 A1 | 12/2013 | Zhang et al. |
| 2014/0019650 A1 | 1/2014 | Li et al. |
| 2014/0068372 A1 | 3/2014 | Zhang et al. |
| 2014/0082450 A1 | 3/2014 | Yang et al. |
| 2014/0089759 A1 * | 3/2014 | Draper .................. H04L 1/0045 714/766 |
| 2014/0313610 A1 | 10/2014 | Zhang et al. |
| 2014/0325303 A1 | 10/2014 | Yang et al. |
| 2014/0372836 A1 | 12/2014 | Li et al. |
| 2015/0039978 A1 | 2/2015 | Nguyen et al. |
| 2015/0081626 A1 | 3/2015 | Yang et al. |
| 2015/0082115 A1 | 3/2015 | Xia et al. |
| 2015/0113205 A1 | 4/2015 | Cai et al. |
| 2015/0143196 A1 | 5/2015 | Zhang et al. |
| 2016/0308556 A1 * | 10/2016 | Cai .................. G11B 20/1833 |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 723-727 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, W., "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al 'A Viterbi Algorithm with Soft-Decision Outputs and its Applications in Proc. IEEE Globecom, pp. 47. 11-47 Dallas, TX Nov. 1989.

(56) References Cited

OTHER PUBLICATIONS

Han et al., "Pinning Techniques for Low-Floor Detection/Decoding of LDPC-Coded Partial Response Channels", 5th International Symposium on Turbo Codes &Related Topics, 2008.
Kautz, "Fibonacci Codes for Synchronization Control", IEEE Trans. Info. Theory, vol. 11, No. 2, pp. 284-292 (Apr. 1965).
Kschischang et al., "Factor Graphs and the Sum-Product Algorithm", IEEE Transactions on Information Theory, vol. 47, No. 2 (Feb. 2001).
Leduc-Primeau et al., "A Relaxed Half-Stochastic Iterative Decoder for LDPC Codes", IEEE Communications Society, IEEE Globecom proceedings (2009).
Lee et al., "Partial Zero-Forcing Adaptive Mmse Receiver for OS-CDMA Uplink in Multicell Environments" IEEE Transactions on Vehicular Tech. vol. 51, No. 5, Sep. 2002.
Li et al "Efficient Encoding of Quasi-Cyclic Low-Density Parity Check Codes" IEEE Transactions on Communications on 53 (11) 1973-1973, 2005.
Lim et al. "Convergence Analysis of Constrained Joint Adaptation in Recording Channels" IEEE Trans. on Signal Processing vol. 54, No. 1 Jan. 2006.
Lin et al "An efficient VLSI Architecture for nonbinary LDPC decoders"—IEEE Transaction on Circuits and Systems 11 vol. 57, Issue 1 (Jan. 2010) pp. 51-55.
Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Patapoutian et al "Improving Re-Read Strategies by Waveform Averaging" IEEE Transactions on Mag. vol. 37 No. 6, Nov. 2001.
Planjery et al "Finite Alphabet Iterative Decoders, pt 1: Decoding Beyond Beliver Propagation on BSC" Jul. 2012, printed from the internet Apr. 21, 2014 http://arxiv.org/pdf/1207.4800.pd.
Richardson, T., "Error Floors of LDPC Codes" Flarion Technologies Bedminster NJ 07921, tjr@flarion.com (not dated).
Shokrollahi "LDPC Codes: An Introduction", Digital Fountain, Inc. (Apr. 2, 2003).
Spagnol et al, "Hardware Implementation of GF(2Am) LDPC Decoders", IEEE Transactions on Circuits and Systems-I: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing Maximum-Transition-Run Code Constraints and Low-Density Parity-Check Decoding," IEEE Transactions on Magnetics, vol. 40, No. 6, (Nov. 2004).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/-ikliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

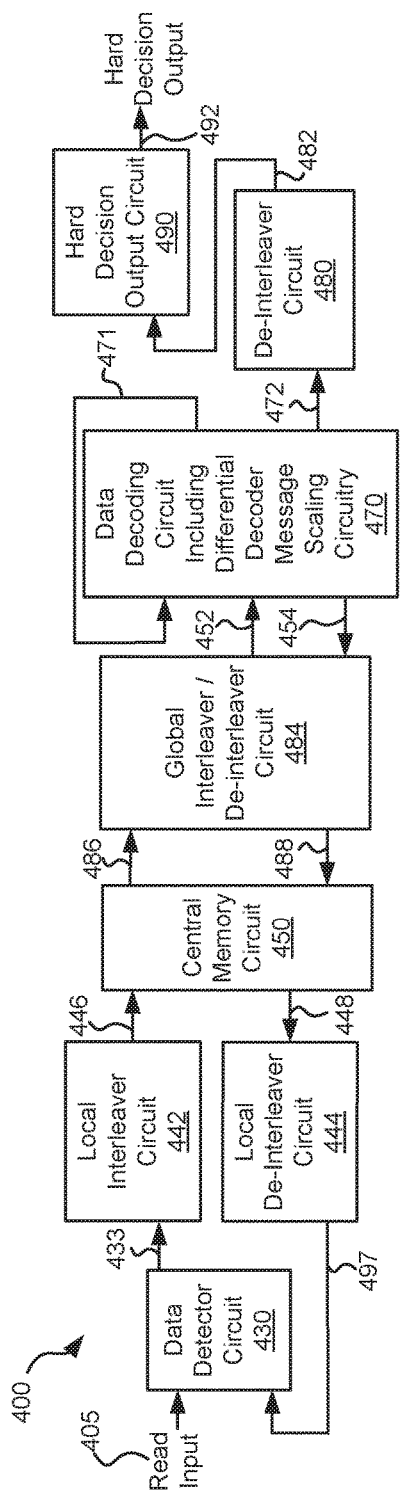
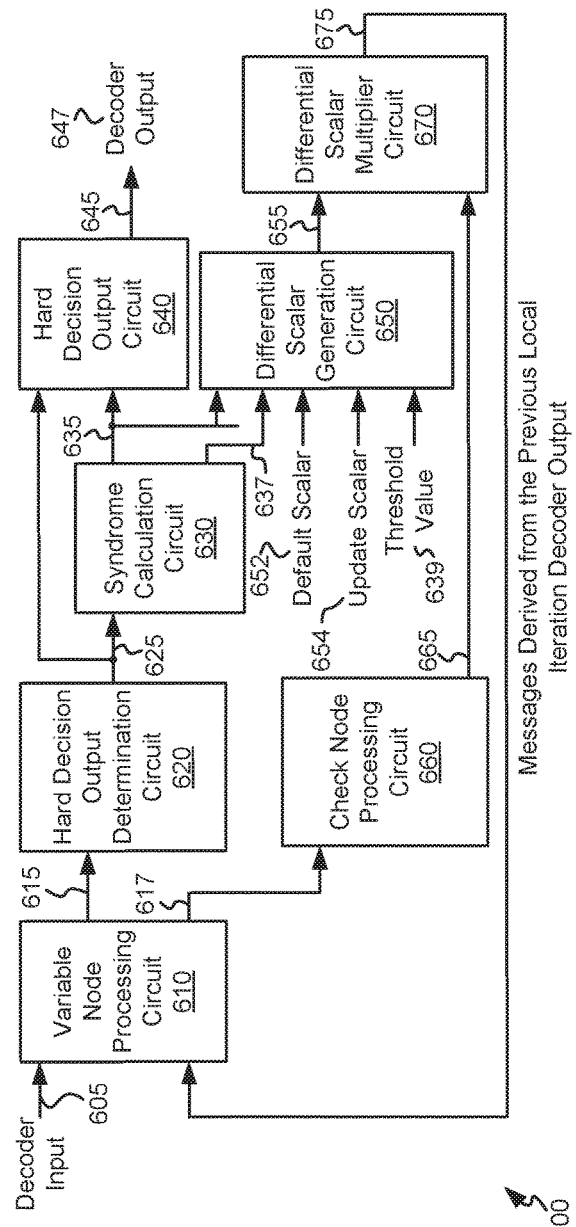
Fig. 4a
Fig. 4b

SYSTEMS AND METHODS FOR DIFFERENTIAL MESSAGE SCALING IN A DECODING PROCESS

CROSS-REFERENCE TO RELATED APPLICATIONS

This application is a Continuation application of U.S. patent application Ser. No. 14/261,333, filed on 24 Apr. 2014 and entitled SYSTEMS AND METHODS FOR DIFFERENTIAL MESSAGE SCALING IN A DECODING PROCESS, now U.S. Pat. No. 9,378,765, issued on 28 Jun. 2016, which claims the benefit of the filing date of U.S. Provisional Application No. 61/974,894, filed 3 Apr. 2014, and entitled SYSTEMS AND METHODS FOR DIFFERENTIAL MESSAGE SCALING IN A DECODING PROCESS, the disclosures of which are incorporated, in their entireties, by this reference.

FIELD OF THE INVENTION

Systems and method relating generally to data processing, and more particularly to systems and methods for scaling messages in a data decoding circuit.

BACKGROUND

Data transfer devices are operable to transfer data from a transmission device to a receiver device. The transmission device applies an encoding algorithm to yield an encoded data set, and the decoding device applies a decoding algorithm to reverse the encoding algorithm and thereby yield the original data set. In some cases, the data decoding algorithm will stall, and thereby the original data set cannot be recovered. Such situations result in an inability to recover the original data.

Hence, for at least the aforementioned reasons, there exists a need in the art for advanced systems and methods for decoding encoded data sets

SUMMARY

Systems and method relating generally to data processing, and more particularly to systems and methods for scaling messages in a data decoding circuit.

Various embodiments of the present invention provide data processing systems that include a data decoder circuit. The data decoder circuit is operable to: apply a variable node algorithm to a data input to yield a first set of variable node to check node messages, and apply a check node algorithm to the first set of variable node to check node messages to yield a set of check node to variable node messages during a first iteration; calculate a number of errors remaining based upon a preceding set of variable node to check node messages, wherein the preceding set of variable node to check node messages precedes the first set of variable node to check node messages; calculate a number of errors based upon the first set of variable node to check node messages; calculate a difference between the number of errors based upon the first set of variable node to check node messages and the number of errors remaining based upon a preceding set of variable node to check node messages; multiply the set of check node to variable node messages by respective scalar values selected based at least in part on the difference to yield a scaled set of check node to variable node messages; and apply the variable node algorithm to the scaled set of check node to variable node messages to yield a second set of variable node to check node messages.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 4a-4c show a data processing circuit including differential decoder message scaling circuitry in accordance with some embodiments of the present invention.

DETAILED DESCRIPTION OF SOME EMBODIMENTS

Figure 1:
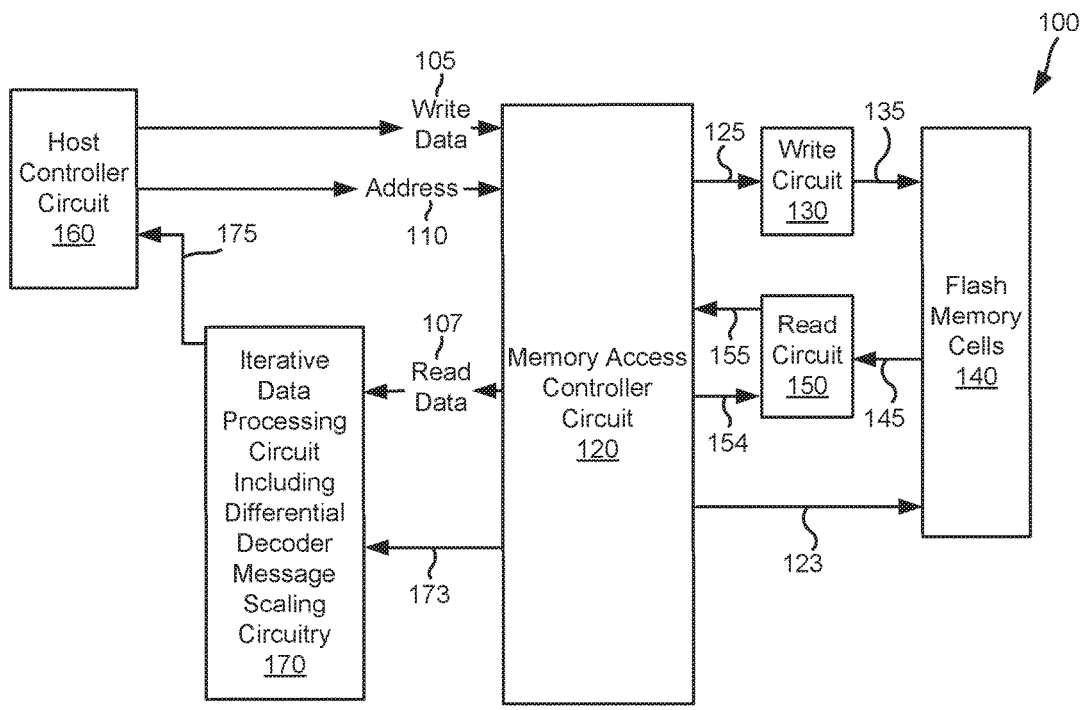
FIG. 1 shows a solid state storage device including an iterative data processing circuit having differential decoder message scaling circuitry in accordance with various embodiments of the present invention.

Systems and method relating generally to data processing, and more particularly to systems and methods for scaling messages in a data decoding circuit.

Various embodiments of the present invention provide data processing systems that include a data decoder circuit. The data decoder circuit is operable to: apply a variable node algorithm to a data input to yield a first set of variable node to check node messages, and apply a check node algorithm to the first set of variable node to check node messages to yield a set of check node to variable node messages during a first iteration; calculate a number of errors remaining based upon a preceding set of variable node to check node messages, wherein the preceding set of variable node to check node messages precedes the first set of variable node to check node messages; calculate a number of errors based upon the first set of variable node to check node messages;

calculate a difference between the number of errors based upon the first set of variable node to check node messages and the number of errors remaining based upon a preceding set of variable node to check node messages; multiply the set of check node to variable node messages by respective scalar values selected based at least in part on the difference to yield a scaled set of check node to variable node messages; and apply the variable node algorithm to the scaled set of check node to variable node messages to yield a second set of variable node to check node messages.

In some instances of the aforementioned embodiments, all elements of the set of check node to variable node messages are multiplied by the same scalar value when the difference is greater than a threshold value. In some such instances, the threshold value is user programmable. In one or more instances of the aforementioned embodiments, the decoder circuit is further operable to: identify one or more check node to variable node messages associated with each of the calculated number of errors based upon the first set of variable node to check node messages. In such instances, multiplying the set of check node to variable node messages by respective scalar values includes multiplying each of the one or more check node to variable node messages associated with each of the calculated number of errors based upon the first set of variable node to check node messages by a first scalar value, and multiplying each of the other of the variable node messages by a second scalar value. In some cases, at least one of the first scalar value and the second scalar value is user programmable. In various cases, multiplying each of the one or more check node to variable node messages associated with each of the calculated number of errors based upon the first set of variable node to check node messages by the first scalar value, and multiplying each of the other of the variable node messages by the second scalar value is done when the difference is less than a threshold value; and wherein multiplying the set of check node to variable node messages by respective scalar values includes multiplying all elements of the set of check node to variable node messages are multiplied by the second scalar value when the difference is greater than the threshold value.

A method for data processing that include: applying a variable node algorithm to a data input by a variable node processing circuit to yield a first set of variable node to check node messages; applying a check node algorithm to the first set of variable node to check node messages to yield a set of check node to variable node messages during a first iteration; calculating a number of errors remaining based upon a preceding set of variable node to check node messages, wherein the preceding set of variable node to check node messages precedes the first set of variable node to check node messages; calculating a number of errors based upon the first set of variable node to check node messages; calculating a difference between the number of errors based upon the first set of variable node to check node messages and the number of errors remaining based upon a preceding set of variable node to check node messages; multiplying the set of check node to variable node messages by respective scalar values selected based at least in part on the difference to yield a scaled set of check node to variable node messages; and re-applying the variable node algorithm to the scaled set of check node to variable node messages to yield a second set of variable node to check node messages.

Turning to FIG. 1, a solid state storage device 100 including an iterative data processing circuit 170. Iterative data processing circuit 170 includes differential decoder message scaling circuitry in accordance with various embodiments of the present invention. Storage device 100 additionally includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. For example, where flash memory cells are two bit cells (i.e., depending upon the read voltage, a value of '11', '10', '00', or '01' is returned), the following voltages may be applied to store the data:

| Two Bit Data Input | Voltage Output |
|---|---|
| '11' | V3 |
| '10' | V2 |
| '00' | V1 |
| '01' | V0 |

Where V3 is greater than V2, V2 is greater than V1, and V1 is greater than V0. It should be noted that the aforementioned table is merely an example, and that different devices may assign different bit values to the different voltage thresholds. For example in other cases the values in the following table may be used:

| Two Bit Data Input | Voltage Output |
|---|---|
| '01' | V3 |
| '00' | V2 |
| '10' | V1 |
| '11' | V0 |

Of course, other bit patterns may be assigned to different thresholds.

A data read is effectuated when host controller circuit 160 provides address 110 along with a request to read data from the corresponding location in flash memory cells 140. Memory access controller 120 accesses a read voltage 145 from locations indicated by address 123 and compares the voltage to a number of threshold values 154 to reduce the voltage to a multi-bit read data 155. Using the same two bit example, the following multi-bit read data 155 results:

| Voltage Input | Two Bit Data Output |
|---|---|
| >V2 | '11' |
| >V1 | '10' |
| >V0 | '00' |
| <=V0 | '01' |

This multi-bit read data 155 is provided from memory access controller 120 to data processing circuit 170 as read data 107. Iterative data processing circuit 170 applies a data decoding algorithm to read data 107 using soft data 173 that is either accessed or generated by memory access controller circuit 120. Soft data may either be provided from flash memory cells 140 where such are available, or may be generated by memory access controller circuit 120. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Iterative data processing circuit 170 repeatedly applies a data decoding algorithm to read data 107 and soft data 174 to yield a decoded output. Where the decoded output converges (i.e., results in a correction of all remaining errors in read data 107), the decoded output is provided as read data 175. Where the decoded output fails to converge (i.e., errors remain in the decoded output), another iteration of the data decoding algorithm is applied to read data 107 guided by the previous decoded output to yield an updated decoded output. A syndrome corresponding to the decoded output is calculated. Where the syndrome is zero, the decoded output has converged. Where the difference between syndrome weights (as used herein, the term "syndrome value" is used in its broadest sense to mean either a value of the resulting syndrome or a weight of the resulting syndrome) of successive iterations is not greater than a threshold value, all of the check node outputs generated as part of the data decoding process are multiplied by a default scaling factor. Alternatively, where the difference between syndrome weights of successive iterations is greater than a threshold value a potential trapping set is indicated. In such a situation, each check node value associated with an unsatisfied check are multiplied by an updated scaling factor and the other check node values that are not associated with an unsatisfied check are multiplied by the default scaling factor. The result of the multiplications are provided as an updated received codeword. The next iteration of the data decoding process is guided by the updated received codeword. This iterative decoding process continues until either all errors are corrected or a timeout condition occurs. In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention. The iterative data processing circuit may be implemented similar to that discussed below in relation to FIGS. 4*a*-4*c* (although without including the data detector circuit as that is not necessary in a solid state drive), and/or may operate using an approach similar to that discussed below in relation to FIGS. 5*a*-5*b*.

Figure 2:
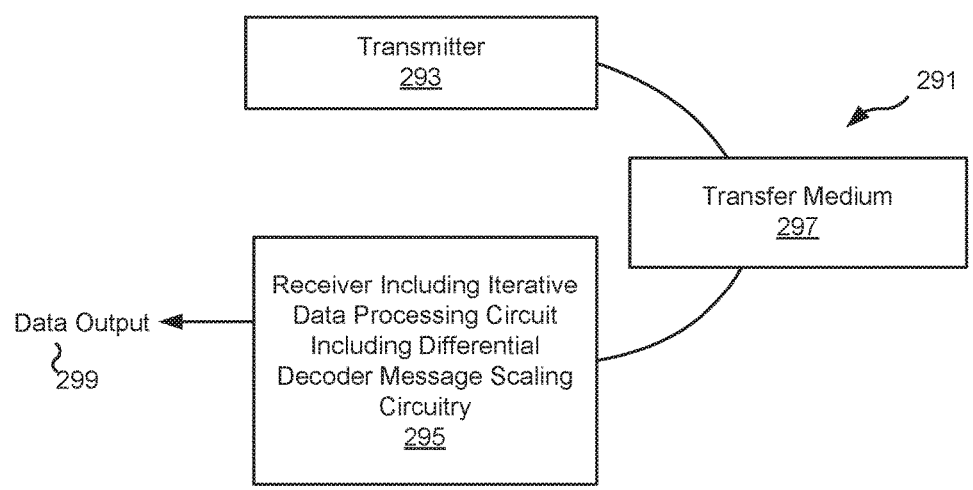
FIG. 2 depicts a data transmission system including an iterative data processing circuit having differential decoder message scaling circuitry in accordance with one or more embodiments of the present invention.

Turning to FIG. 2, a data transmission system 291 including a receiver 295 having throughput preservation and clock rate reduction power control circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. Receiver 295 provides the processed data as a data output 299 to a host (not shown).

As part of processing the received information, receiver 295 utilizes a data processing circuit that includes both a data detection circuit and a data decode circuit. In some cases, multiple iterations through the data decoder circuit (i.e., local iterations) for each pass through both the data detection circuit and the data decoder circuit (i.e., global iterations). During each pass through the data decoder circuit, selected scaling factors are applied to check node to variable node messages passed as part of the data decode algorithm and the scaling factor is adaptively adjusted in an effort to recover an originally written data set. In this process, where the decoded output fails to converge (i.e., errors remain in the decoded output), another iteration of the data decoding algorithm is applied to input data guided by the previous decoded output to yield an updated decoded output. A syndrome corresponding to the decoded output is calculated. Where the syndrome is zero, the decoded output has converged. Where the difference between syndrome weights of successive iterations is not greater than a threshold value, all of the check node outputs generated as part of the data decoding process are multiplied by a default scaling factor. Alternatively, where the difference between syndrome weights of successive iterations is greater than a threshold value a potential trapping set is indicated. In such a situation, each check node value associated with an unsatisfied check are multiplied by an updated scaling factor and the other check node values that are not associated with an unsatisfied check are multiplied by the default scaling factor. The result of the multiplications are provided as an updated received codeword. The next iteration of the data decoding process is guided by the updated received codeword. This iterative decoding process continues until either all errors are corrected or a timeout condition occurs. In some embodiments of the present invention, the data decoding algorithm is a low density parity check algorithm as is known in the art. The iterative data processing circuit may be implemented similar to that discussed below in relation to FIGS. 4*a*-4*c* (although it may additionally include an analog to digital converter circuit and one or more filter circuits used to process an originally received data set), and/or may operate using an approach similar to that discussed below in relation to FIGS. 5*a*-5*b*.

Figure 3:
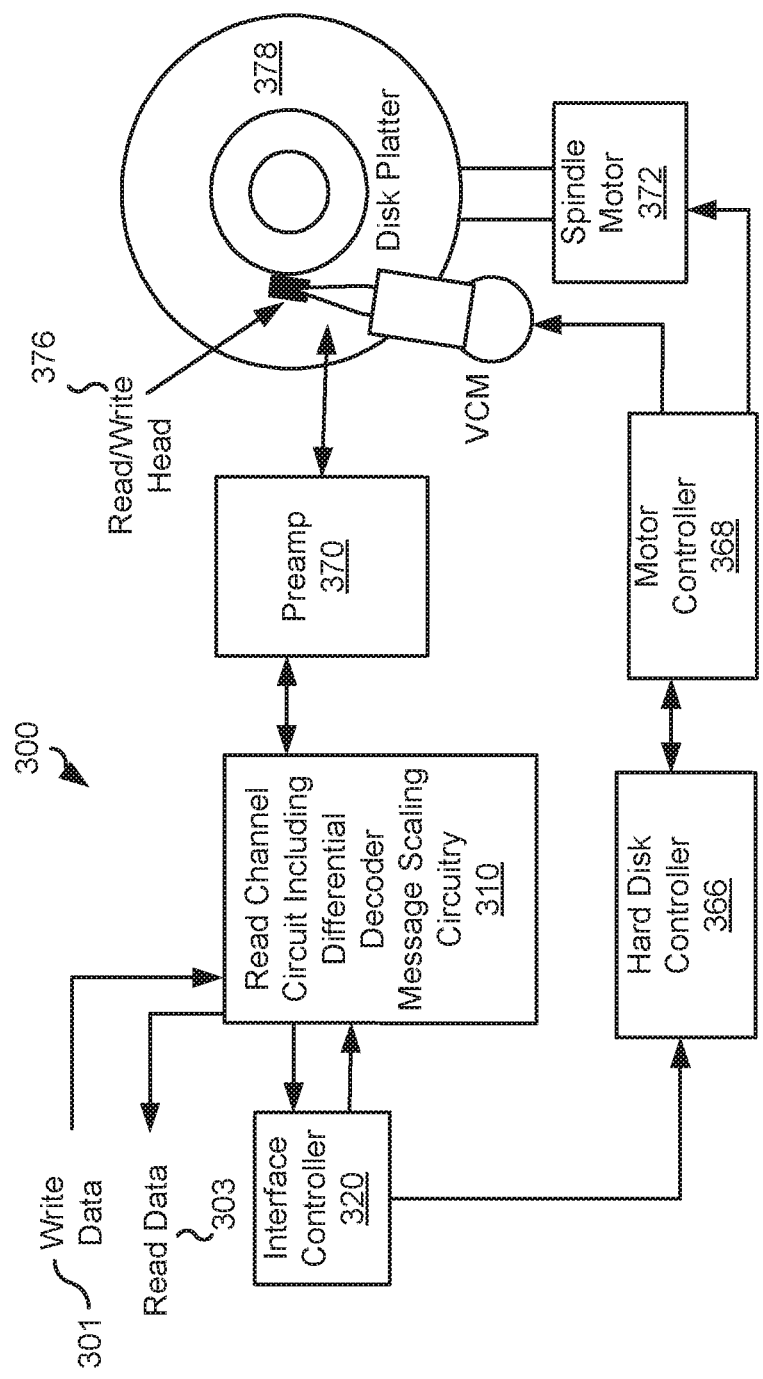
FIG. 3 shows a storage system including differential decoder message scaling circuitry in accordance with various embodiments of the present invention.

Turning to FIG. 3, a storage system 300 including a read channel circuit 310 having differential decoder message scaling circuitry is shown in accordance with various embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

As part of processing the received information, read channel circuit 310 may utilize a data processing circuit that includes both a data detection circuit and a data decode circuit. In some cases, multiple iterations through the data decoder circuit (i.e., local iterations) for each pass through both the data detection circuit and the data decoder circuit (i.e., global iterations). During each pass through the data decoder circuit, selected scaling factors are applied to check node to variable node messages passed as part of the data decode algorithm and the scaling factor is adaptively adjusted in an effort to recover an originally written data set. In this process, where the decoded output fails to converge (i.e., errors remain in the decoded output), another iteration of the data decoding algorithm is applied to input data guided by the previous decoded output to yield an updated decoded output. A syndrome corresponding to the decoded output is calculated. Where the syndrome is zero, the decoded output has converged. Where the difference between syndrome weights of successive iterations is not greater than a threshold value, all of the check node outputs generated as part of the data decoding process are multiplied by a default scaling factor. Alternatively, where the difference between syndrome weights of successive iterations is greater than a threshold value a potential trapping set is indicated. In such a situation, each check node value associated with an unsatisfied check are multiplied by an updated scaling factor and the other check node values that are not associated with an unsatisfied check are multiplied by the default scaling factor. The result of the multiplications are provided as an updated received codeword. The next iteration of the data decoding process is guided by the updated received codeword. This iterative decoding process continues until either all errors are corrected or a timeout condition occurs. In some embodiments of the present invention, the data decoding algorithm is a low density parity check algorithm as is known in the art. The iterative data processing circuit may be implemented similar to that discussed below in relation to FIGS. 4a-4c (although it may additionally include an analog to digital converter circuit and one or more filter circuits used to process an originally received data set), and/or may operate using an approach similar to that discussed below in relation to FIGS. 5a-5b.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 4C:
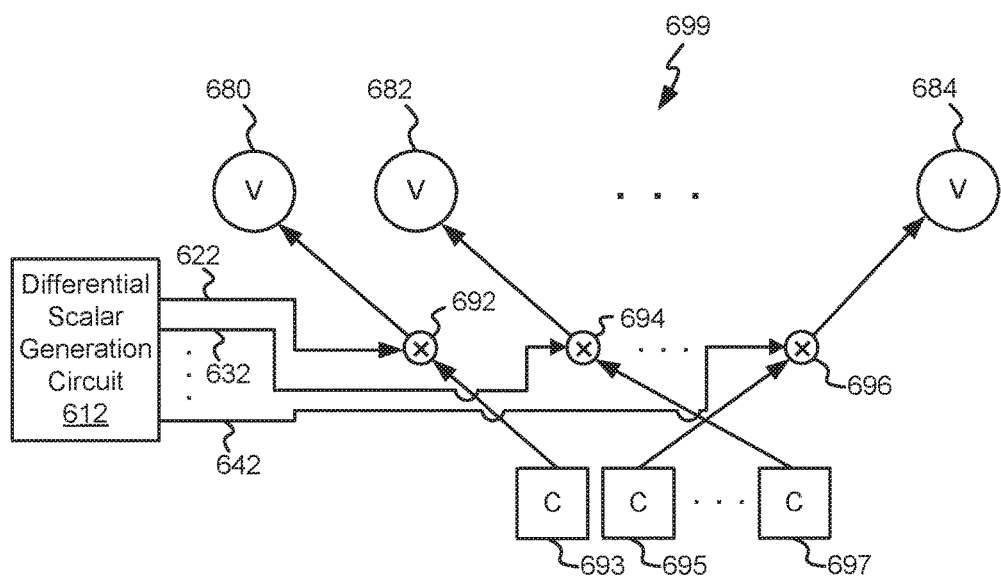

FIGS. 4a-4c show a data processing circuit 400 including differential decoder message scaling circuitry in accordance with some embodiments of the present invention. Turning to FIG. 4a, data processing circuit 400 includes a data detector circuit 430 that applies a data detection algorithm to a read input 405 guided by, when available, a de-interleaved output 497. Read input 405 may be derived from an analog front end circuit (not shown) where the received data is an analog input. Based upon the disclosure provided herein, one of ordinary skill in the art will recognize a variety of analog processing circuits that may be used in relation to various embodiments of the present invention.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword (provided as read input 405). In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations. Data detector circuit 430 applies the data detection algorithm at a rate governed by a variable rate clock 434.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data is log likelihood data (LLR) as is known in the art. Detected output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once a data decoding circuit 470 is available, a previously stored interleaved codeword 446 is accessed from central memory circuit 450 as a stored codeword 486 and globally interleaved by a global interleaver/de-interleaver circuit 484. Global interleaver/De-interleaver circuit 484 may be any circuit known in the art that is capable of globally rearranging codewords. Global interleaver/De-interleaver circuit 484 provides a decoder input 452 into data decoding circuit 470. In some embodiments of the present invention, the data decode algorithm applied by data decoding circuit 470 is a low density parity check algorithm as are known in the art. Based upon the disclosure provided herein, one of ordinary skill in the art will recognize other decode algorithms that may be used in relation to different embodiments of the present invention. Data decoder circuit 470 is augmented to include novel differential decoder message scaling circuitry. One example of such decoder message scaling circuitry is described in more detail below in relation to FIGS. 4b-4c. As more fully described below, data decoder circuit implements a belief-propagation algorithm that passes soft data or log likelihood data as messages along edges of a Tanner graph. These messages are multiplied by respective scaling factors that are selected based upon changes in a calculated syndrome weight between iterations of the data decoding algorithm. In particular, where a the difference between syndrome weights of successive iterations is not greater than a threshold value, all of the check node outputs generated as part of the data decoding process are multiplied by a default scaling factor. Alternatively, where the difference between syndrome weights of successive iterations is greater than a threshold value a potential trapping set is indicated. In such a situation, each check node value associated with an unsatisfied check are multiplied by an updated scaling factor and the other check node values that are not associated with an unsatisfied check are multiplied by the default scaling factor. The result of the multiplications are provided as an updated received codeword 471 that is used to guide a later iteration of the data decoding algorithm applied by data decoding circuit 470.

Local iterations of data decoding circuit 470 may continue until either a current syndrome weight is zero indicating convergence of the data decoding algorithm (i.e., all errors are corrected), or a timeout condition such as a maximum number of local iterations through data decoding circuit 470 has occurred. In a case where the current syndrome weight is calculated as zero, the result of the data decoding is provided as a decoded output 472. Decoded output 472 is provided to a de-interleaver circuit 480 that rearranges the data to reverse both the global and local interleaving applied to the data to yield a de-interleaved output 482. De-interleaved output 482 is provided to a hard decision output circuit 490. Hard decision output circuit 490 is operable to re-order data sets that may complete out of order back into their original order. The originally ordered data sets are then provided as a hard decision output 492.

Where application of the data decoding algorithm fails to converge and a number of local iterations through data decoder circuit 470 exceeds a threshold, the resulting decoded output is provided as a decoded output 454 back to central memory circuit 450 if a maximum number of global iterations as indicated by a global iteration control 498 has not been exceeded. In this case, decoded output 454 is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425. Alternatively, where application of the data decoding algorithm fails to converge and the number of local iterations exceeds a maximum and the number of global iterations exceeds a maximum, an error is generated indicating a failure to converge by data decoding circuit 470.

Of note, a solid state drive typically does not include utilize a data detector circuit, and as such only applies local iterations of data decoding circuit 470. In such a case, at least data detector circuit 430, local interleaver circuit 442, local de-interleaver circuit 444, central memory circuit 450 can be eliminated. The algorithm of data decoding circuit 470 is applied directly to read input 405 where read input 405 is connected directly to decoder input 452. Based upon the disclosure provided herein, one of ordinary skill in the art will recognize a variety of adaptations that may be made to data processing circuit 400 to tailor it to the specific implementation.

Turning to FIG. 4b, one implementation of data decoder circuit 370 including differential decoder message scaling circuitry is shown in accordance with some embodiments of the present invention. The implementation is shown as a data decoder circuit 600. Data decoder circuit 600 includes a variable node processing circuit 610 that is operable to calculated variable node to check node messages (V2C messages) based upon a decoder input 605 (corresponding to decoder input 452 of FIG. 4) and, where available, scaled check node to variable node messages (scaled C2V messages) 675. The V2C messages are provided as a variable node data output 615 to a hard output determination circuit 615 and as a variable node data output 617 to a check node processing circuit 660. Any circuit known in the art for performing variable node processing may be used for variable node processing circuit 610.

Hard decision output determination circuit 620 assigns hard decision values to each element of variable node output data 615. This includes selecting a binary value or a symbol value based upon variable node data output 615. Any circuit known in the art for converting variable node information to hard decision data may be used for hard decision output determination circuit 620. The determined hard decisions are provided as a hard decision output 625 to both a syndrome calculation circuit 630, and to a hard decision output circuit 640.

Syndrome calculation circuit 630 calculates a syndrome weight 635 for hard decision output 625. The magnitude of syndrome weight 635 corresponds to a number of errors remaining in hard decision output 625. Where syndrome weight 635 is zero, there are no remaining errors in hard decision output 625, and as such a hard decision output circuit 640 is enabled to provided hard decision output 625 as a decoder output 647.

Alternatively, where syndrome weight 635 is non-zero, errors remain in hard decision output 625. In such a circumstance, syndrome calculation circuit 630 provides a location output 637 to a differential scalar generation circuit 650. Location output 650 indicates which check nodes are unsatisfied. Differential scalar generation circuit 650 includes a buffer (not shown) that stores a previous instance of syndrome weight 635, a summation circuit (not shown) that subtracts a current instance of syndrome weight 635 from the previous instances of syndrome weight 635 to yield a difference output (not shown), and a comparator circuit (not shown) that compares the difference output with a threshold value 639.

Based upon the comparison of the difference output with threshold value 639, differential scalar generation circuit 650 generates an array of scalar values 655 to include an individual scalar value for each check node of data decoding circuit 600. In particular, where the difference value is not greater than threshold value 639, then a default scalar 652 is selected for all of the individual scalar values in array of scalar values 655. Alternatively, where the difference value is greater than threshold value 639, then an update scalar value 654 is selected for the individual scalar values in array of scalar values 655 that correspond to the check nodes identified by location output 637, and default scalar 652 is selected for all other individual scalar values in array of scalar values 655. One or more of default scalar 652, update scalar value 654 and/or threshold value 639 may be user programmable.

Check node processing circuit 660 applies check node processing to variable node data output 617 to yield interim check node to variable node messages (interim C2V messages). Any circuit known in the art for performing check node processing may be used for check node processing circuit 660. The interim C2V messages are provided as a message array 665 along with array of scalar values 655 to a differential scalar multiplier circuit 670. Differential scalar multiplier circuit 670 multiplies each of the interim C2V messages received as message array 665 by the corresponding scalar value from array of scalar values 655 to yield scaled C2V messages 675.

Turning to FIG. 4c, a portion of a Tanner graph 690 representing the belief-propagation algorithm applied by data decoder circuit 470 and data decoder circuit 600. As shown, log-likelihood data passing from C-nodes (i.e., check nodes) 693, 695, 697 to V-nodes (i.e., variable nodes) 680, 682, 684 are provided to respective multiplication circuits 692, 694, 696 where they are multiplied by individual scaling factors 622, 632, 642 received from differential scalar generation circuit 650. Individual scaling factors 622, 632, 642 are respective values in array of scalar values 655. As discussed above, individual scaling factors 622, 632, 642 are individually selected to be either default scalar 652 or update scalar 654 based upon a difference between syndrome weights for suc+cessive iterations of the data decoding algorithm and which of C-nodes 693, 695, 697 are associated with an unsatisfied check.

Figure 5A:
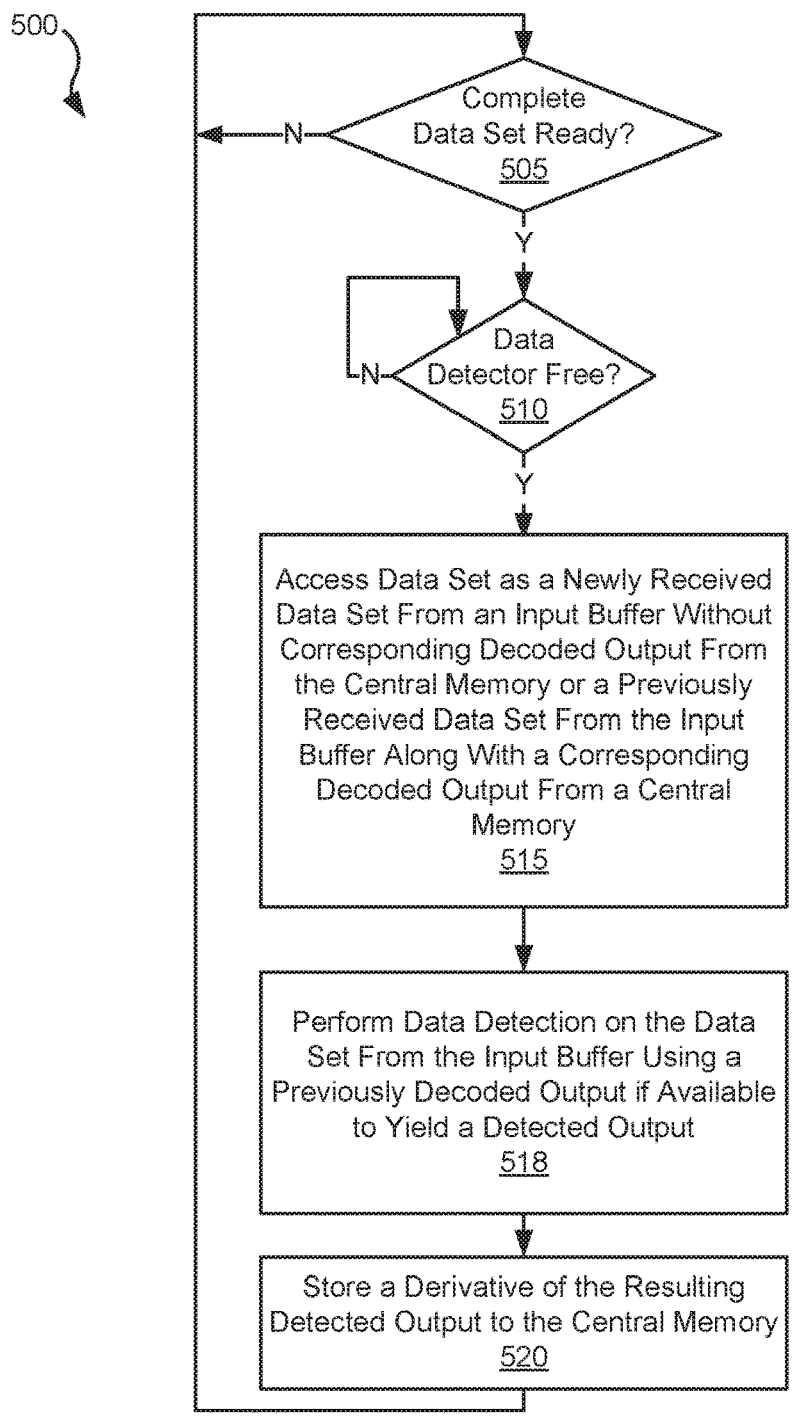
FIGS. 5a-5b are flow diagrams showing a method for data processing that includes differential decoder message scaling in a data decode algorithm in accordance with some embodiments of the present invention.
Figure 5B:
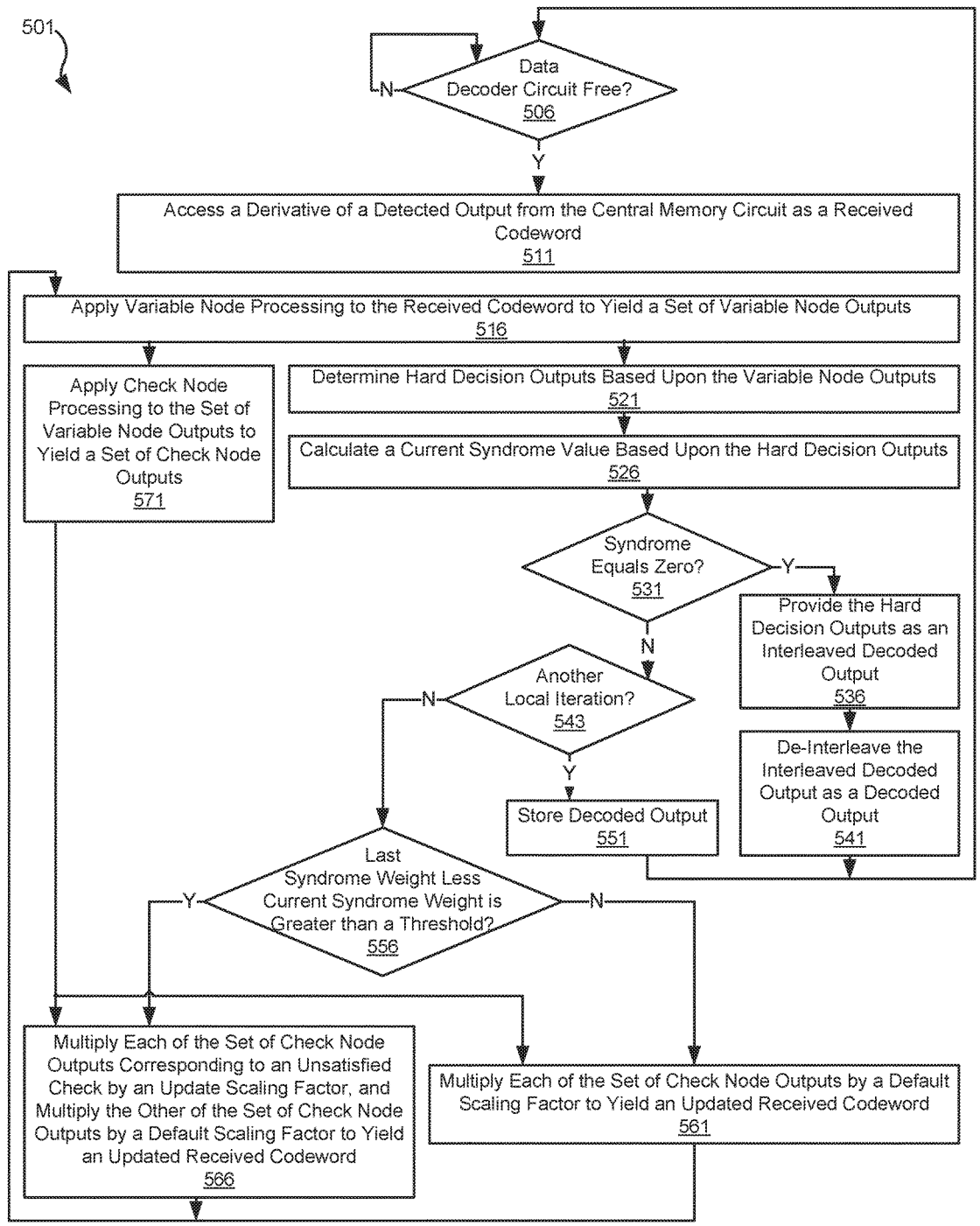

Turning to FIG. 5a, a flow diagram 500 shows a process for data processing through a data detector circuit and a data decoder circuit that includes differential decoder message scaling. Following flow diagram 500, it is determined whether a data set is ready for application of a data detection algorithm (block 505). In some cases, a data set is ready when it is received from a data decoder circuit via a central memory circuit. In other cases, a data set is ready for processing when it is first made available from an front end processing circuit. Where a data set is ready (block 505), it is determined whether a data detector circuit is available to process the data set (block 510).

Where the data detector circuit is available for processing (block 510), the data set is accessed by the available data detector circuit (block 515). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 518). The data detection is performed at a variable processing rate that is more fully described below. Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 520). The derivative of the detected output may be, for example, an interleaved or shuffled version of the detected output. Again, where the method of FIGS. 5a-5b is to be applied to a solid state memory device, the process of data detection discussed in relation to flow diagram 500 may be eliminated as the data detection process is not needed.

In parallel to the previously described data detection process, it is determined whether a data decoder circuit is available (block 506). The data decoder circuit may be, for example, a low density data decoder circuit applying a belief-propagation data decode algorithm as are known in the art. Where the data decoder circuit is available (block 506), a previously stored derivative of a detected output is accessed from the central memory and used as a received codeword (block 511). Variable node processing is applied to the received codeword to yield a set of variable node outputs (block 516). In particular, variable node processing calculates variable node to check node messages (V2C messages) based upon a the received codeword and, where available, an updated received codeword (see blocks 561, 566) in the form of scaled check node to variable node messages (i.e., scaled C2V messages).

Check node processing is applied to the set of variable node outputs (blocks 571). The check node processing yields a set of check node outputs (C2V messages). Any circuit known in the art for performing check node processing may be used to perform the check node processing. In addition, hard decision outputs based upon the set of variable node outputs are determined (block 521). Determining the hard decision outputs includes assigning hard decision values to each element in the set of variable node outputs. This includes selecting a binary value or a symbol value for each element or symbol of the set of variable node outputs. Any approach known in the art for converting variable node information to hard decision data may be used.

A current syndrome weight is calculated based upon the hard decision outputs (block 526). The magnitude of the calculated current syndrome corresponds to a number of errors remaining in the hard decision outputs. Where the calculated current syndrome weight is zero (block 531), there are no remaining errors in hard decision outputs and as such a hard decision outputs are provided as an interleaved decoded output (block 536). The interleaved decoded output is de-interleaved to yield a decoded output (block 541).

Alternatively, where the calculated current syndrome weight is non-zero (block 531), errors remain in hard decision output. In such a circumstance, it is determined whether another local iteration is allowed (block 543). In some cases, as a default seven local iterations are allowed per each global iteration, or a total of one hundred local iterations where only one global iteration is used. In a solid state storage device the data detection process is not used, and in such cases no global iterations are counted, and a total of, for example, one hundred local iterations are allowed. Where another local iteration is not desired (block 543), the decoded output is stored (block 551) and the processes of data detection of FIG. 5a (where relevant) are performed before data decoding processing of FIG. 5b are re-performed.

Alternatively, where another local iteration is not desired (block 543), it is determined whether the previously calculated syndrome weight (i.e., the syndrome weight calculated for the preceding local iteration) less the currently calculated syndrome weight from block 526 is greater than a threshold value (block 556) in accordance with the following equation:

Difference=Previously Calculated Syndrome Weight−Currently Calculated Syndrome Weight; and Difference?>Threshold Value.

For example, for a code with four checks the previously calculated syndrome weight may be 1101 and the currently calculated syndrome weight may be 1011. In such a case, the syndrome weight is the same for both, and thus the 'N' transition from block 556 is taken. In some cases, the threshold value is user programmable. Where the difference is not greater than the threshold value (block 556), each element of the set of check node outputs generated as part of block 571 is multiplied by the same default scaling factor to yield an updated received codeword (block 561). In contrast, where the difference is greater than the threshold value (block 556), each element of the set of check node outputs generated as part of block 571 corresponding to an unsatisfied check (i.e., an error) is multiplied by an update scaling factor, and the other elements of the set of check node outputs are multiplied by the default scaling factor to yield an updated received codeword (block 566). In some embodiments of the present invention, one or both of the default scaling factor and/or the update scaling factor is/are user programmable.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

The invention claimed is:

1. A data processing system comprising:
a data decoder circuit of a storage drive operable to:
calculate a first number of errors remaining based upon a preceding set of variable node to check node messages, the preceding set of variable node to check node messages precedes a first set of variable node to check node messages;
calculate a second number of errors based upon the first set of variable node to check node messages;
determine a scaled set of check node to variable node messages based on one or more scalar values, the one or more scalar values being selected based at least in part on a difference between the first and second number of errors; and
apply the variable node algorithm to the scaled set of check node to variable node messages to yield a second set of variable node to check node messages.

2. The data processing system of claim 1, the data decoder circuit operable to:
apply a check node algorithm to the first set of variable node to check node messages to yield a set of check node to variable node messages during a first iteration;
wherein all elements of the set of check node to variable node messages are multiplied by the same scalar value to determine the scaled set of check node to variable node messages when the difference is greater than a threshold value.

3. The data processing system of claim 2, wherein the threshold value is user programmable.

4. The data processing system of claim 1, wherein the data decoder circuit is further operable to:
identify one or more check node to variable node messages associated with each of the calculated second number of errors; and
multiplying each of the one or more check node to variable node messages associated with each of the calculated second number of errors by a first scalar value, and multiplying each of the other of the variable node messages by a second scalar value.

5. The data processing system of claim 4, wherein at least one of the first scalar value and the second scalar value is user programmable.

6. The data processing system of claim 4, wherein
multiplying each of the one or more check node to variable node messages associated with each of the calculated second number of errors by the first scalar value, and multiplying each of the other of the variable node messages by the second scalar value is done when the difference is less than a threshold value; and
multiplying all elements of the set of check node to variable node messages by the second scalar value when the difference is greater than the threshold value.

7. The data processing system of claim 6, wherein the threshold value is user programmable.

8. The data processing system of claim 1, wherein the data processing system is implemented as part of an integrated circuit.

9. The data processing system of claim 1, wherein the data decoder circuit is a low density parity check decoder circuit.

10. The data processing system of claim 1, wherein the storage drive is associated with at least one of: a solid state storage device, a hard disk drive, and a communication device, or any combination thereof.

11. The data processing system of claim 1, wherein the data decoder circuit comprises:
a variable node processing circuit operable to apply a variable node algorithm to a data input to yield the first set of variable node to check node messages; and
a check node processing circuit operable to apply the check node algorithm to the first set of variable node to check node messages to yield a set of check node to variable node messages during a first iteration.

12. The data processing system of claim 11, wherein the data decoder circuit further comprises:
a syndrome calculation circuit operable to calculate a syndrome value corresponding to the second number of errors calculated based upon the first set of variable node to check node messages;
a buffer circuit operable to store a syndrome value corresponding to the first number of errors remaining calculated based upon the preceding set of variable node to check node messages; and
a summation circuit operable to subtract the syndrome value corresponding to the second number of errors calculated from the syndrome value corresponding to the first number of errors remaining calculated.

13. The data processing system of claim 1, wherein the data decoder circuit further comprises:
an array of multiplier circuits including one multiplier circuit for each check node to variable node messages in a set of check node to variable node messages, wherein each of the multiplier circuits in the array of multiplier circuits is individually programmable to receive a selected scalar value.

14. The data processing system of claim 1, wherein the data processing system further comprises:
a data detector circuit operable to apply a data detection algorithm to a data set to yield a detected output, and wherein a data input is derived from the detected output.

15. A method for data processing, the method comprising:
calculating, by a data processing circuit of a storage device, a first number of errors remaining based upon a preceding set of variable node to check node messages, wherein the preceding set of variable node to check node messages precedes a first set of variable node to check node messages;
calculating, by the data processing circuit, a second number of errors based upon the first set of variable node to check node messages;
determining, by the data processing circuit, a scaled set of check node to variable node messages using one or more scalar values, the one or more scalar values being selected based at least in part on a difference between the first and second number of errors; and
applying, by the data processing circuit, a variable node algorithm to the scaled set of check node to variable node messages to yield a second set of variable node to check node messages.

16. The method of claim 15, further comprising:
applying a check node algorithm to the first set of variable node to check node messages to yield a set of check node to variable node messages during a first iteration;
wherein all elements of the set of check node to variable node messages are multiplied by the same scalar value when the difference is greater than a threshold value.

17. The method of claim 15, further comprising:
identifying one or more check node to variable node messages associated with each of the calculated second number of errors based upon the first set of variable node to check node messages;
multiplying each of the one or more check node to variable node messages associated with each of the calculated second number of errors by a first scalar value, and multiplying each of the other of the variable node messages by a second scalar value.

18. The method of claim 17, wherein at least one of the first scalar value and the second scalar value is user programmable.

19. The method of claim 17, wherein:
multiplying each of the other of the variable node messages by the second scalar value the difference is less than a threshold value; and
multiplying all elements of the set of check node to variable node messages by the second scalar value when the difference is greater than the threshold value.

20. A storage device, comprising:
a storage medium;
a data processing circuit operable to process a data input derived from the storage medium, the data processing circuit operable to:
calculate a first number of errors remaining based upon a preceding set of variable node to check node messages, the preceding set of variable node to check node messages precedes a first set of variable node to check node messages;
calculate a second number of errors based upon the first set of variable node to check node messages;

determine a scaled set of check node to variable node messages based on one or more scalar values, the one or more scalar values being selected based at least in part on a difference between the first and second number of errors; and apply the variable node algorithm to the scaled set of check node to variable node messages to yield a second set of variable node to check node messages.

* * * * *